US005897668A

United States Patent [19]
Furushima

[11] Patent Number: 5,897,668
[45] Date of Patent: Apr. 27, 1999

[54] MEMORY SYSTEM FOR STORING INFORMATION DATA AND STATE-OF-RADIO-TRANSMISSION DATA

[75] Inventor: Susumu Furushima, Yokohama, Japan

[73] Assignee: Matsushita Electric Industrial Co., Ltd., Osaka, Japan

[21] Appl. No.: 08/586,317

[22] Filed: Jan. 17, 1996

[30] Foreign Application Priority Data

Jan. 24, 1995 [JP] Japan .................................... 7-027208

[51] Int. Cl.⁶ .................................................. G06F 12/00
[52] U.S. Cl. ........................................................... 711/220
[58] Field of Search ........................................ 711/5, 220

[56] References Cited

U.S. PATENT DOCUMENTS

| | | | |
|---|---|---|---|
| 5,036,486 | 7/1991 | Noguchi et al. | 365/49 |
| 5,123,012 | 6/1992 | Suzuki et al. | 370/66 |
| 5,434,857 | 7/1995 | Mori | 370/66 |

*Primary Examiner*—Eddie P. Chan
*Assistant Examiner*—Kevin Verbrugge
*Attorney, Agent, or Firm*—Pollock, Vande Sande & Amernick

[57] ABSTRACT

In a memory system capable of using a common address for reading out a combination of upper-digit data and lower-digit data, there are provided an upper-digit memory element 1 for exclusively storing upper-digit data $\alpha(0,0)$ - - - $\alpha(i,n-1)$; a lower-digit memory element 2 for exclusively storing lower-digit data $\beta(0)$ - - - $\beta(i)$; and inherent address designating means 3–6 for designating individual inherent addresses ADR-a, ADR-b of the upper-digit memory element 1 and the lower-digit memory element 2 in accordance with first address $A(0,0)$ - - - $A(i,n-1)$ specifying a read or write position, and for designating an inherent address ADR-b of the lower-digit memory element 2 in accordance with second address $B(0)$ - - - $B(i)$ used for reading or writing only the lower-digit memory element 2. When the upper-digit data is stored into the upper-digit memory element 1, the first address $A(0,0)$ - - - $A(i,n-1)$ is designated, while when the lower-digit data is stored into the lower-digit memory element 2, the second address $B(0)$ - - - $B(i)$ is designated, thereby omitting minor arithmetic computations in the storing operation of upper-digit data and lower-digit data to the same address. When the data is read out, the first address $A(0,0)$ - - - $A(i,n-1)$ is designated to read out a combination of upper-digit data $\alpha(0,0)$ - - - $\alpha(i,n-1)$ stored in the upper-digit memory element 1 and lower-digit data $\beta(0)$ - - - $\beta(i)$ stored in the lower-digit memory element 2.

4 Claims, 8 Drawing Sheets

FIG. 2
PRIOR ART

18 ⋯ ADDRESS ON PROGRAM
19 ⋯ INFORMATION DATA
20 ⋯ STATE-OF-RADIO-TRANSMISSION DATA

| 18 – A(0, 0)   | 19 – α(0, 0)   | β(0) | 20 |
|---|---|---|---|
| 18 – A(0, 1)   | 19 – α(0, 1)   | β(0) | 20 |
| 18 – A(0, 2)   | 19 – α(0, 2)   | β(0) | 20 |
| 18 – A(0, 3)   | 19 – α(0, 3)   | β(0) | 20 |

⋮  #0 TIME SLOT DATA

| 18 – A(0, n-1) | 19 – α(0, n-1) | β(0) | 20 |
| 18 – A(1, 0)   | 19 – α(1, 0)   | β(1) | 20 |
| 18 – A(1, 1)   | 19 – α(1, 1)   | β(1) | 20 |
| 18 – A(1, 2)   | 19 – α(1, 2)   | β(1) | 20 |
| 18 – A(1, 3)   | 19 – α(1, 3)   | β(1) | 20 |

⋮  #1 TIME SLOT DATA

| 18 – A(1, n-1) | 19 – α(1, n-1) | β(1) | 20 |

⋮

| 18 – A(i, 0)   | 19 – α(i, 0)   | β(i) | 20 |
| 18 – A(i, 1)   | 19 – α(i, 1)   | β(i) | 20 |
| 18 – A(i, 2)   | 19 – α(i, 2)   | β(i) | 20 |
| 18 – A(i, 3)   | 19 – α(i, 3)   | β(i) | 20 |

⋮  #i TIME SLOT DATA

| 18 – A(i, n-1) | 19 – α(i, n-1) | β(i) | 20 |

STEP 1

STEP 2

STEP 3

STEP 4

STEP 5

STEP 6

STEP 7

FIG. 5

| INPUT | OUTPUT | | | | | |
|---|---|---|---|---|---|---|
| ADR | JUDGE SIGNAL A | JUDGE SIGNAL B | SELECT SIGNAL a | ADR-a | SELECT SIGNAL b | ADR-b |
| A(0, 0) | 1 | 0 | 1 | a(0, 0) | 1 | b(0) |
| A(0, 1) | | | | a(0, 1) | | |
| A(0, 2) | | | | a(0, 2) | | |
| A(0, 3) | | | | a(0, 3) | | |
| ⋮ | | | | ⋮ | | |
| A(0, n-1) | | | | a(0, n-1) | | |
| A(1, 0) | | | | a(1, 0) | | b(1) |
| A(1, 1) | | | | a(1, 1) | | |
| A(1, 2) | | | | a(1, 2) | | |
| A(1, 3) | | | | a(1, 3) | | |
| ⋮ | | | | ⋮ | | |
| A(1, n-1) | | | | a(1, n-1) | | |
| ⋮ | | | | ⋮ | | ⋮ |
| A(i, 0) | | | | a(i, 0) | | b(i) |
| A(i, 1) | | | | a(i, 1) | | |
| A(i, 2) | | | | a(i, 2) | | |
| A(i, 3) | | | | a(i, 3) | | |
| ⋮ | | | | ⋮ | | |
| A(i, n-1) | | | | a(i, n-1) | | |
| B(0) | 0 | 1 | 0 | * | 1 | b(0) |
| B(1) | | | | | | b(1) |
| B(2) | | | | | | b(2) |
| B(3) | | | | | | b(3) |
| ⋮ | | | | | | ⋮ |
| B(i) | | | | | | b(i) |
| OTHER ADDRESS | 0 | 0 | 0 | * | 0 | * |

\* ⋯ ARBITRARY VALUE

STEP 1

STEP 2

STEP 3

⋮

STEP n

STEP n+1

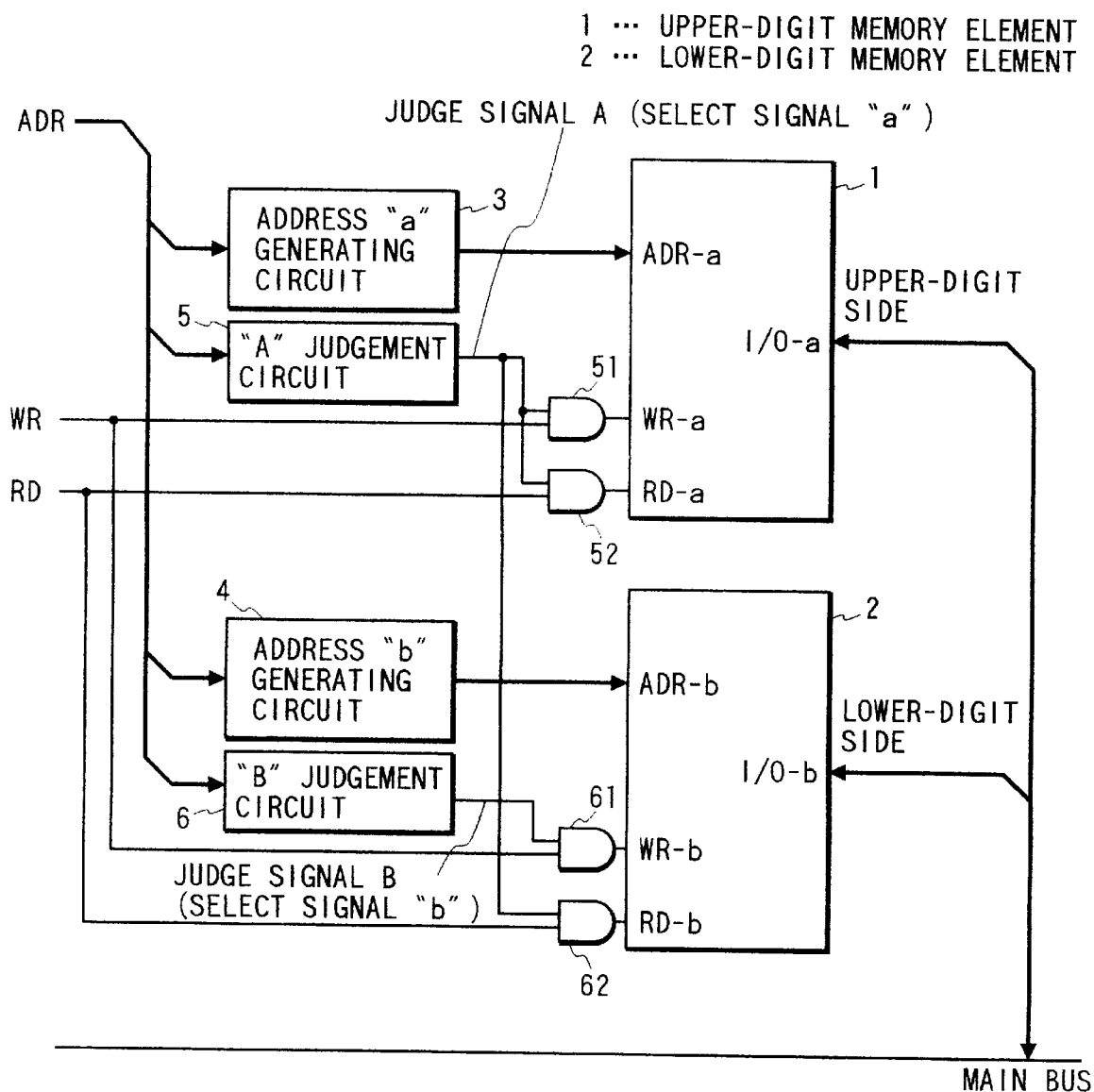

MEMORY SYSTEM FOR STORING INFORMATION DATA AND STATE-OF-RADIO-TRANSMISSION DATA

BACKGROUND OF THE INVENTION

1. Field of the Invention

The present invention generally relates to a memory system incorporated in a digital signal processor used in the field of mobile communications, such as time division multiple access (TDMA) systems, or the like, and more particularly to a memory system capable of simplifying the procedure of data storing processing.

2. Prior Art

The mobile communication system generally comprises a transmitter and a receiver, at least either of which is carried on a vehicle or a moving object for the communication through radio transmission. From such circumstances, the mobile communication system is generally subjected to the fading or similar phenomenon occurring in the moving circumstances, accompanied by state of radio transmission being fairly unstabilized. This is why the transmission error occurs so frequently in the mobile communications.

To solve this problem, it is effective to encode information data at the transmitter side so that, if any error is generated during radio transmission, such errors can be corrected later at the receiver side. Namely, the receiver side performs an error-correcting operation by decoding the transmitted information data. In such an error-correcting operation, the error-correcting accuracy will be improved by utilizing the information indicating the state of radio transmission through which the information data is propagated.

Meanwhile, when the mobile communication system employs the TDMA (time division multiple access) system, a predetermined time period is divided into a plurality of time slots respectively assigned or allocated to each of plural channels for multiplexing the information data.

In this case, there is the possibility that some trouble is concentrated on a specific part (specific time slot). To avoid fatal damage even in such serious conditions, a technology usually employed is an interleave operation according to which the order of time slots is intentionally varied in every cycle for allocating the information data. When the interleave operation is performed at the transmitter side, burst error can be preferably reduced or lightened to the level of random errors in favor of execution of error-correcting operation.

On the other hand, at the receiver side, a normally employed technology to decode such information data is a de-interleave operation according to which a reverse operation of the above-described interleave operation is performed to rearrange or reconstruct the data into the original form.

A digital signal processor, performing the decoding of digital signals, generally comprises a memory system for temporarily storing data generated during the computations. The de-interleave operation is normally performed in the process of storing the data into this memory system.

To this end, an address pointer designates an address in the memory system so as to intentionally switch the address in compliance with the principle of de-interleave in the process of storing data. By this operation, the decoded data are rearranged by the original order and stored in the memory system.

In this case, it is essential to assign a common address to one information data and its corresponding state-of-radio-transmission data so that they form combined or coupled data stored in a predetermined region of the memory system designated by the common address. The state-of-radio-transmission data represents the state of radio transmission through which each time slot carrying information data is propagated.

This kind of recording device, as shown in FIG. 1, comprises a memory element 11 memorizing information data and corresponding state-of-radio-transmission data, an address generating circuit 12 converting an address (ADR) on the program (hereinafter, referred to "program address (ADR)") into an inherent address of memory element 11, a judgement circuit 13 making a judgement based on the program address (ADR) as to whether or not memory element 11 is selected, an arithmetic circuit 14 generating data as a combination of information data and its corresponding state-of-radio-transmission data, and general purpose registers 15, 16 and 17 temporarily storing the result of arithmetic circuit 14.

The writing operation of this memory system is initiated upon entry of both the program address (ADR) and a write signal (WR). The program address (ADR), after being converted into the inherent address of memory element 11 by address generating circuit 12, is entered into memory element 11. The judgement circuit 13, when it identifies that the program address (ADR) is the address assigned to the memory element 11, generates a select signal indicating the fact that memory element 11 is selected.

In response to this select signal, the write signal (WR) is entered in memory element 11 after taking a logical product between the select signal and the write signal (WR). Then, any data entered from a data input/output terminal (I/O-c) is stored in a specific region of memory element 11 designated by the inherent address generated from address generating circuit 12.

Meanwhile, the reading operation of this memory system is initiated upon entry of both the program address (ADR) and a read signal (RD). The program address (ADR), after being converted into the inherent address of memory element 11 by address generating circuit 12, is entered into memory element 11. The judgement circuit 13, when it identifies that the program address (ADR) is the address assigned to the memory element 11, generates the select signal indicating the fact that memory element 11 is selected.

In response to this select signal, the read signal (RD) is entered in memory element 11 after taking a logical product between the select signal and the read signal (RD). Then, the data stored in the specific region of memory element 11 designated by the inherent address corresponding to the program address (ADR) are read out and outputted from the data input/output terminal (I/O-c).

The memory element 11 of this memory system, as illustrated in a memory map shown in FIG. 2, has a storage region designated by program address A(i,j) 18 for storing a combination of each information data $\alpha(i,j)$ 19 transmitted by time slot i and a corresponding state-of-radio-transmission data $\beta(i)$ 20. In the storage region covering address A(0,0) through A(0,n−1), the upper-digit region stores information data 19 transmitted by #0 time slot, while the lower-digit region stores state-of-radio-transmission data 20 inherent to #0 time slot.

Similarly, in the storage region covering address A(i,0) through A(i,n−1), the upper-digit region stores information data 19 transmitted by #i time slot, while the lower-digit region stores state-of-radio-transmission data 20 inherent to #i time slot.

The time slots, if their time slot numbers are identical, have common state-of-radio-transmission data 20 inherent to the same time slot. Hence, the storage region of #1 time slot, corresponding to address A(i,0) through A(i,n−1), has the same lower-digit data β(i).

Each data, as a combination of one information data and its corresponding state-of-radio-transmission data, is produced by arithmetic circuit 14 using general purpose registers 15 through 17. FIG. 3 shows a flow chart illustrating the procedure for producing the combination of data, using #0 data and #1 data of #i time slot stored in address A(i,0) and address A(i,1).

Step 1: Arithmetic circuit 14 obtains a bit logical product (i.e. bit AND) between data 21 and data 22. The former data 21 has an upper-digit part representing unknown data and a lower-digit part representing state-of-radio-transmission data β(i), while the latter data 22 has an upper-digit part representing 0 in each digit and a lower-digit part representing 1 in each digit. As a result of this bit AND calculation, arithmetic circuit 14 generates new data 23 having an upper-digit part representing storing 0 in each digit and a lower-digit part representing state-of-radio-transmission data β(i). The newly created data 23 is stored in general purpose register B 16.

Step 2: Next, arithmetic circuit 14 obtains a bit logical product (i.e. bit AND) between data 24 and data 25. The former data 24 has an upper-digit part representing information data a(i,0) and a lower-digit part representing unknown data, while the latter data 25 has an upper-digit part representing 1 in each digit and a lower-digit part representing 0 in each digit. As a result of this bit AND calculation, arithmetic circuit 14 generates new data 26 having an upper-digit part representing information data a(i,0) and a lower-digit part representing 0 in each digit. The newly created data 26 is stored in general purpose register A 15.

Step 3: Subsequently, arithmetic circuit 14 obtains a bit logical product (i.e. bit OR) between data 26 stored in general purpose register A 15 and data 23 stored in general purpose register B 16, thus generating new data 27 as a result of this bit OR calculation. The newly created data 27 is stored in general purpose register C 17. At this moment, information data α(i,0) and state-of-radio-transmission data β(i) inherent to #i time slot are coupled for the first time as one of combination data.

Step 4: Thus obtained data 27 is transferred into a storage region designated by address A(i,0) dedicated to #0 data of #i time slot.

Subsequently, #1 data of #i time slot to be stored in a storage region designated by address A(i,1) is created.

Step 5: Arithmetic circuit 14 obtains a bit logical product (i.e. bit AND) between data 28 and data 25. The former data 28 has an upper-digit part representing information data α(i,1) and a lower-digit part representing unknown data, while the latter data 25 has an upper-digit part representing 1 in each digit and a lower-digit part representing 0 in each digit. As a result of this bit AND calculation, arithmetic circuit 14 generates new data 29 having an upper-digit part representing information data α(i,1) and a lower-digit part representing 0 in each digit. The newly created data 29 is stored in general purpose register A 15.

For the same time slots, the state-of-radio-transmission data is common among them; therefore, the state-of-radio-transmission data for #i time slot can be specified as β(i). Accordingly, data 23 used for creating #0 data of #i time slot and stored in general purpose register B 16 can be directly used as the state-of-radio-transmission data.

Step 6: Subsequently, arithmetic circuit 14 obtains a bit logical product (i.e. bit OR) between data 29 stored in general purpose register A 15 and data 23 stored in general purpose register B 16, thus generating new data 30 as a result of this bit OR calculation. The newly created data 30 is stored in general purpose register C 17. At this moment, information data α(i,1) and state-of-radio-transmission data β(i) are coupled for the first time as one of combination data.

Step 7: Thus obtained data 30 is transferred into a storage region designated by address A(i,1) allocated to #1 data of #i time slot.

To accomplish the creation of all data of #i time slot, it is necessary to repeat the above-described operation until the data number reaches n−1. Accordingly, a total of 3n+1 steps will be required to accomplish the storage of all of #i time slot data into memory element 11.

However, according to the above-described conventional memory system, there is the problem that numerous preprocessing steps are required for the computations of bit AND, bit OR and others, before storing a combination of one information data and a corresponding state-of-radio-transmission data into the same storage region designated by a common address.

SUMMARY OF THE INVENTION

In view of the above-described problems encountered in the prior art, the present invention has a principal object to provide a memory system capable of omitting processing steps required for the bit calculations.

To accomplish the above and other related objects, the present invention provides a memory system which is capable of using a common address for reading out a combination of upper-digit data and lower-digit data, comprising: an upper-digit memory element for exclusively storing upper-digit data; a lower-digit memory element for exclusively storing lower-digit data; and inherent address designating means for designating individual inherent addresses of the upper-digit memory element and the lower-digit memory element in accordance with a first address specifying a read or write position, and for designating the inherent address of the lower-digit memory element in accordance with a second address used for reading or writing only the lower-digit memory element.

Another aspect of the present invention provides a memory system which is capable of using a common address for reading out a combination of upper-digit data and lower-digit data, comprising an upper-digit memory element, a lower-digit memory element, a first address generating circuit, a second address generating circuit, a first judgement circuit, and a second judgement circuit.

According to this memory system, the upper-digit memory element exclusively stores upper-digit data representing information data. The lower-digit memory element exclusively stores lower-digit data representing state-of-radio-transmission data inherent to corresponding time slots. The first address generating circuit inputs a program address and converts the entered program address into an inherent address of the upper-digit memory element. The second address generating. circuit inputs the program address and convert the entered program address into an inherent address of the lower-digit memory element.

Meanwhile, the first judgement circuit inputs the program address and judges whether the entered program address is in a one-to-one relationship with any one of inherent addresses of the upper-digit memory element. And, the second judgement circuit inputs the program address and judges whether the entered program address is in a one-to-one relationship with any one of inherent addresses of the lower-digit memory element.

According to features of the preferred embodiments, it is preferable that the inherent address (ADR-a) of the upper-digit memory element comprises a plurality of addresses a(0,0) through a(i,n−1) allocated to store information data α(0,0) through α(i, n−1) of #0 through #i time slots, respectively. The first address generating circuit, when an program address A(j,k) is entered, converts the program address A(j,k) into a corresponding inherent address a(j,k).

On the other hand, the inherent address (ADR-b) of the lower-digit memory element-comprises a plurality of addresses b(0) through b(i) allocated to store state-of-radio-transmission data β(0) through β(i) of #0 through #i time slots, respectively. The second address generating circuit, when any one of program addresses A(j,0) through A(j, n−1) is entered, converts it into an inherent address b(j), and, when a program address B(j) is entered, converts the program address B(j) into an inherent address b(j) in a one-to-one manner.

Thus, both the inherent address a(j,k) of the upper-digit memory element and the inherent address b(j) of the lower-digit memory element are designated by the program address A(j,k), while only the inherent address b(j) of the lower-digit memory element is designated by the program address B(j).

Yet further, according to the features of the preferred embodiments, it is preferable that the first judgement circuit makes a judgement as to whether an entered program address (ADR) is identical with any one of A(0,0) through A(i,n−1), and generates a select signal "a" indicating the fact that the upper-digit memory element is selected when the entered program address (ADR) is identical with any one of A(0,0) through A(i,n−1).

A write signal inherent to the upper-digit memory element is produced by obtaining a logical product between the select signal "a" and a write signal common to all the memory elements, while a read signal inherent to the upper-digit memory element is produced by obtaining a logical product between the select signal "a" and a read signal common to all the memory elements.

On the other hand, the second judgement circuit makes a judgement as to whether the entered program address (ADR) is identical with any one of B(0) through B(i), and generates a judge signal "B" when the entered program address (ADR) is identical with any one of B(0) through B(i). A select signal "b" is produced by obtaining a logical sum between the judge signal "B" and the select signal "a" produced by the first judgement circuit, the select signal "b" indicating the fact that the lower-digit memory element is selected.

A write signal inherent to the lower-digit memory element is produced by obtaining a logical product between the select signal "b" and the write signal common to all the memory elements, while a read signal inherent to the lower-digit memory element is produced by obtaining a logical product between the select signal "b" and the read signal common to all the memory elements.

And, a data input/output terminal of the upper-digit memory element is connected to an upper-digit side of a main bus while a data input/output terminal of the lower-digit memory element is connected to a lower-digit side of the main bus.

Alternatively, according to features of the modified embodiment of the present invention, the write signal inherent to the lower-digit memory element can be produced by obtaining a logical product between the select signal "b" (i.e. judge signal "B" generated from the second judgement circuit) and the write signal common to all the memory elements, while a read signal inherent to the lower-digit memory element can be produced by obtaining a logical product between the select signal "a" produced by the first judgement circuit and the read signal common to all the memory elements.

According to the present invention, when the upper-digit data are stored into the upper-digit memory element, the first address is designated. In response to the first address, the upper-digit data are written into a storage region of the upper-digit memory element specified by an inherent address thereof corresponding to the first address. Meanwhile, when the lower-digit data is stored into the lower-digit memory element, the second address is designated before writing the lower-digit data. In response to the second address, the lower-digit data are written into a storage region of the lower-digit memory element specified by an inherent address thereof corresponding to the second address.

When the data is read out, the first address is designated to read out a combination of upper-digit data stored in the upper-digit memory element and lower-digit data stored in the lower-digit memory element.

According to the arrangement of the present invention, it becomes possible to eliminate or omit the bit arithmetic processing required and executed before storing data in the conventional memory system.

BRIEF DESCRIPTION OF THE DRAWINGS

The above and other objects, features and advantages of the present invention will become more apparent from the following detailed description which is to be read in conjunction with the accompanying drawings, in which:

FIG. 2 is a memory map showing the relationship between address and data in the conventional memory system;

FIG. 5 is a view showing the relationship between input address and various output signals in the memory system of the embodiment of the present invention;

FIG. 8 is a block diagram showing an arrangement of a modified memory system in accordance with the present invention.

DETAILED DESCRIPTION OF THE PREFERRED EMBODIMENTS

Figure 1:
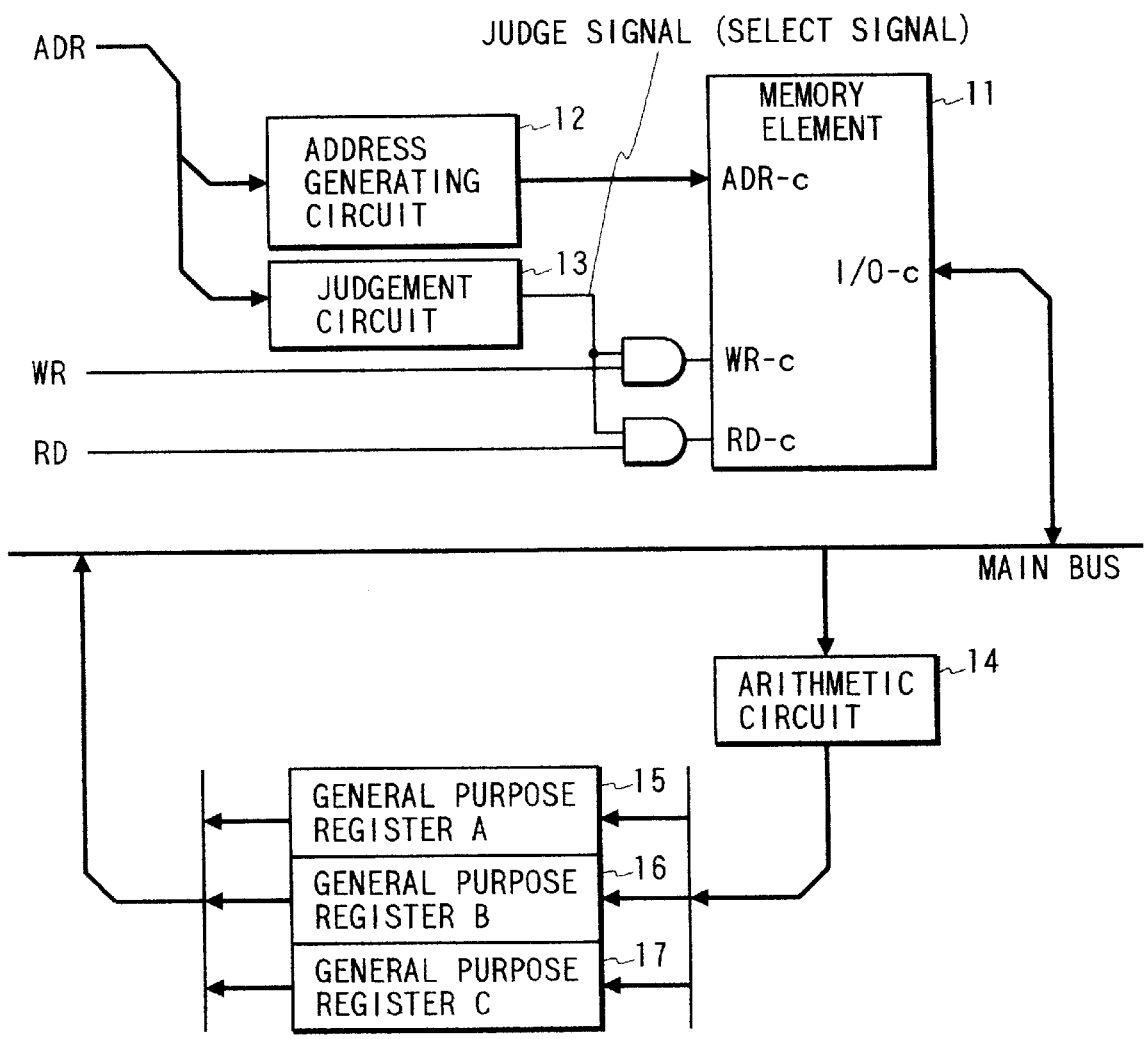
FIG. 1 is a block diagram showing an arrangement of a conventional memory system.
Figure 3:
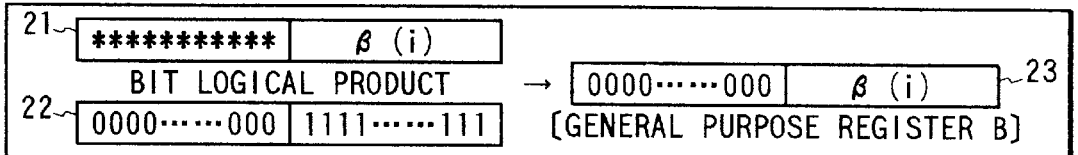
FIG. 3 is a flow chart showing the procedure of storing operation in the conventional memory system.
Figure 3:
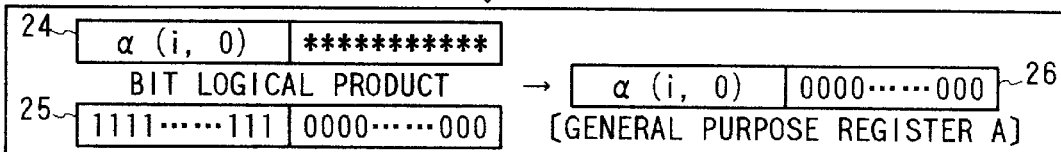
Figure 3:
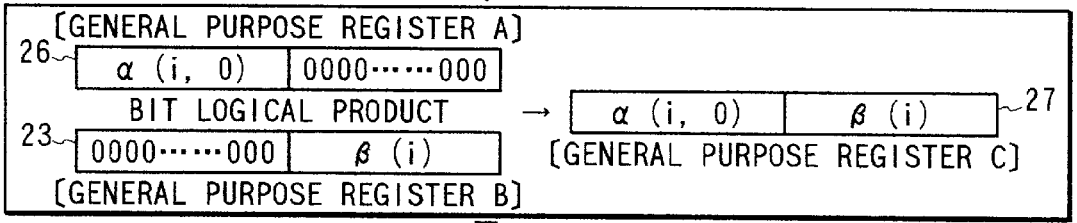
Figure 3:
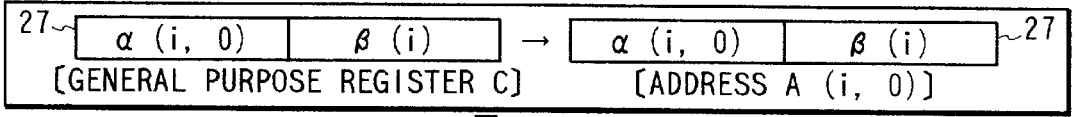
Figure 3:
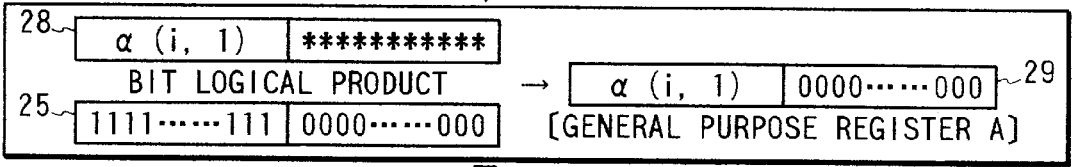
Figure 3:
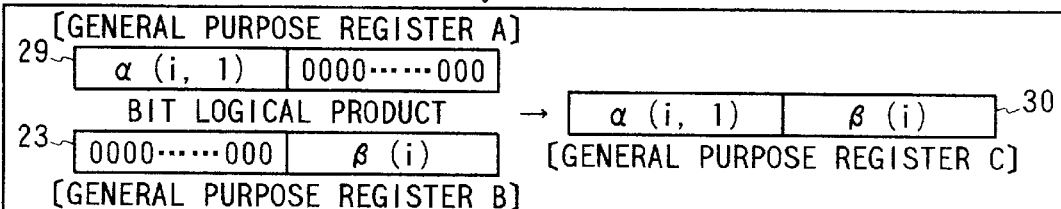
Figure 3:
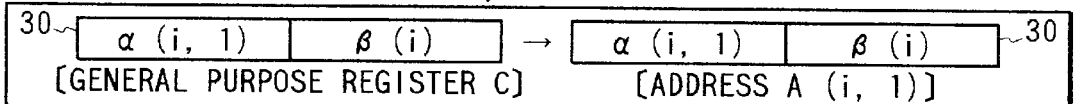

Preferred embodiments of the present invention will be explained in greater detail hereinafter, with reference to the accompanying drawings. Identical parts are denoted by identical reference numerals throughout the views.

Figure 4:
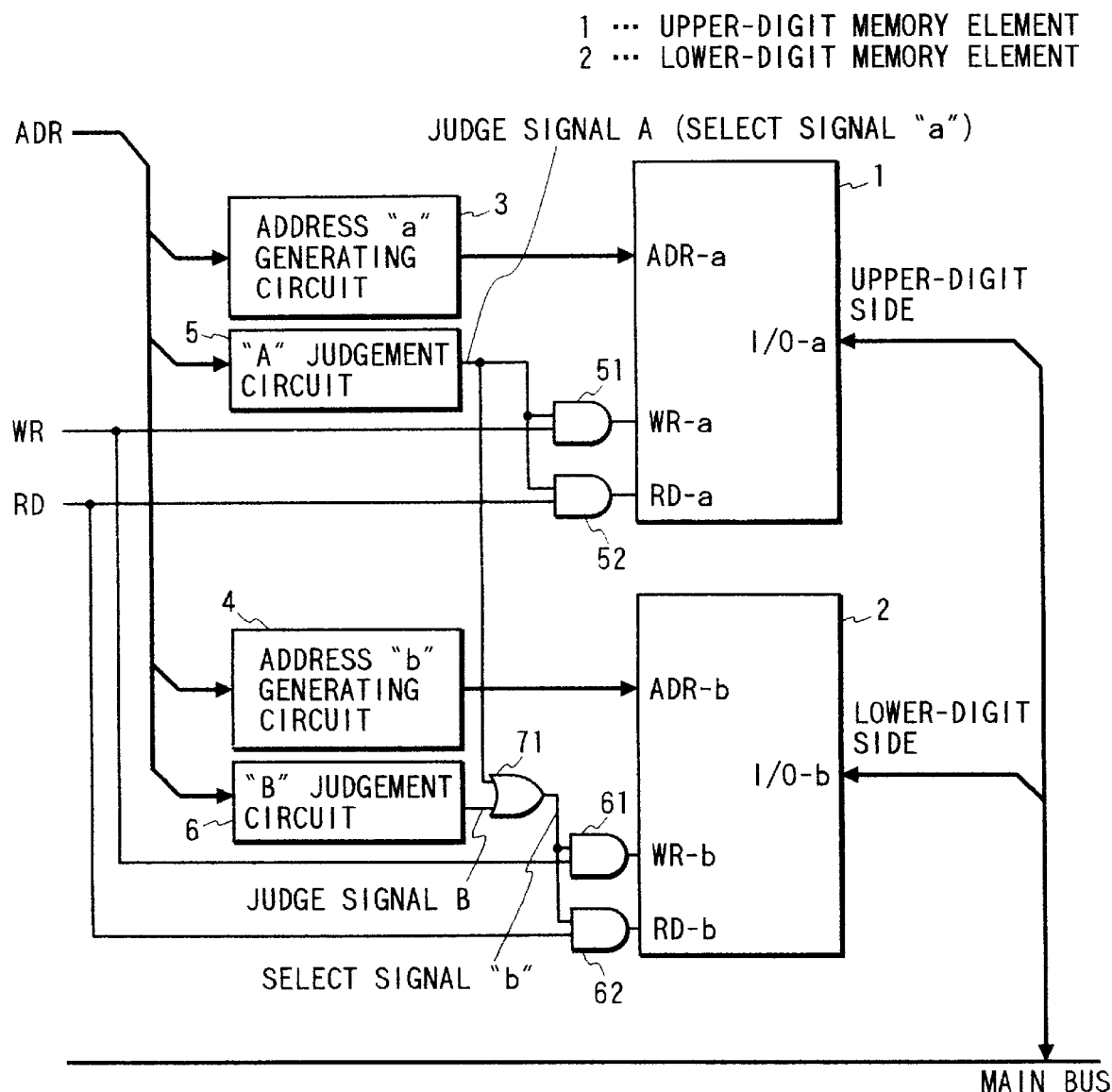
FIG. 4 is a block diagram showing an arrangement of a memory system in accordance with one embodiment of the present invention.

A memory system in accordance with a preferred embodiment of the present invention, as shown in FIG. 4, comprises an upper-digit memory element 1 exclusively memorizing information data, a lower-digit memory element 2 exclusively memorizing state-of-radio-transmission data inherent to the time slot carrying the information data, an address "a" generating circuit 3 converting an entered program address (ADR) into a corresponding inherent address (ADR-a) of upper-digit memory element 1, and an address "b" generating circuit 4 converting an entered program address (ADR) into a corresponding inherent address (ADR-b) of lower-digit memory element 2. also an "A" judgement circuit 5 making a judgement as to whether the entered program address (ADR) is identical with any one of A(0,0) through A(i, n-1.) corresponding to the inherent addresses (ADR-a) of upper-digit memory element 1 in a one-to-one relationship, and a "B" judgement circuit 6 making a judgement as to whether the entered program address (ADR) is identical with any one of B(0) through B(i) corresponding to the inherent addresses (ADR-b) of lower-digit memory element 2 in a one-to-one relationship.

The upper-digit memory element 1 comprises, as inherent address (ADR-a), a(0,0) through a(i,n-1) for storing information data $\alpha(0,0)$–$\alpha(i,n-1)$ covering #0 through #i time slots, respectively. The address "a" generating circuit 3 converts the program address A(j,k) into the corresponding inherent address a(j,k) of upper-digit memory element 1 upon entry of this program address A(j,k).

The lower-digit memory element 2 comprises, an inherent address (ADR-b), b(0) through b(i) for storing state-of-radio-transmission data $\beta(0)$–$\beta(i)$ covering #0 through #i time slots, respectively. When any one of program addresses A(j,0) through A(j,n-1) is entered, the address "b" generating circuit 4 converts the entered program address into its corresponding inherent addresses b(j) of lower-digit memory element 2. Furthermore, when the program address B(j) is entered, it is converted into a corresponding inherent address b(j) of lower-digit memory element 2 in a one-to-one manner.

Accordingly, the inherent address a(j,k) of upper-digit memory element 1 and the inherent address b(j) of lower-digit memory element 2 can be designated by the same program address A(j,k). Meanwhile, only inherent address b(j) of lower-digit memory element 2 can be designated by the program address B(j).

The "A" judgement circuit 5, after making the judgement as to whether the entered program address (ADR) is identical with any one of A(0,0) through A(i, n-1), generates a select signal "a" when the entered address (ADR) is any one of A(0,0) through A(i,n-l). The select signal "a" indicates that the upper-digit memory element 1 is selected by address (ADR). In this case, the judge signal "A" is directly used as the select signal "a".

There is provided an AND circuit 51 having two input terminals receiving the select signal "a" generated from "A" judgement circuit 5 and a write signal WR common to all the memory elements 1, 2, to obtain a logical product between select signal "a" and the common write signal WR. Obtaining the logical product between select signal "a" and the common write signal WR will produce a write signal WR-a inherent to upper-digit memory element 1 which is entered into upper-digit memory element 1 from an output terminal of AND circuit 51.

Meanwhile, there is provided an AND circuit 52 having two input terminals receiving the select signal "a" generated from "A" judgement circuit 5 and a read signal RD common to all the memory elements 1, 2, to obtain a logical product between select signal "a" and the common read signal RD.

Obtaining the logical product between select signal "a" and the common read signal RD will produce a read signal RD-a inherent to upper-digit memory element 1 which is entered into upper-digit memory element 1 from an output terminal of AND circuit 52.

Meanwhile, the "B" judgement circuit 6, after making the judgement as to whether the entered program address (ADR) is identical with any one of B(0) through B(i), generates a judge signal "B" when the entered address (ADR) is any one of B(0) through B(i).

There is provided an OR circuit 71 having two input terminals receiving select signal "a" and judge signal "B", to obtain a logical sum of select signal "a" and judge signal "B".

Obtaining the logical sum between select signal "a" and judge signal "B" will produce a select signal "b" indicating the fact that lower-digit memory element 2 is selected.

Furthermore, there is provided an AND circuit 61 having two input terminals receiving the select signal "b" generated from OR circuit 71 and write signal WR common to all the memory elements 1, 2, to obtain a logical product between select signal "b" and the common write signal WR. Obtaining the logical product between select signal "b" and the common write signal WR will produce a write signal WR-b inherent to upper-digit memory element 2 which is entered into lower-digit memory element 2 from an output terminal of AND circuit 61.

Meanwhile, there is provided an AND circuit 62 having two input terminals receiving the select signal "b" generated from OR circuit 71 and read signal RD common to all the memory elements 1, 2, to obtain a logical product between select signal "b" and the common read signal RD. Obtaining the logical product between select signal "b" and the common read signal RD will produce a read signal RD-b inherent to lower-digit memory element 2 which is entered into lower-digit memory element 2 from an output terminal of AND circuit 62.

A data input/output terminal (I/O-a) of upper-digit memory element 1 is connected to the upper-digit side of main bus, while a data input/output terminal (I/O-b) of lower-digit memory element 2 is connected to the lower-digit side of the main bus.

The procedure for storing data into upper-digit memory element 1 and lower-digit memory element 2 will be explained later. Instead, an operation of reading out the data stored in upper-digit memory element 1 and lower-digit memory element 2 will be explained first hereinafter.

In the reading-out operation, the read signal RD common to all the memory elements is turned on upon entry of any program address ADR to be read out. After accepting A(j,k) as the program address to be read out, address "a" generating circuit 3 enters inherent address a(j,k) into upper-digit memory element 1, while address "b" generating circuit 4 enters inherent address b(j) into lower-digit memory element 2.

The "A" judgement circuit 5 generates the select signal "a" as the entered program address A(j,k) is identical with one of A(0,0) through A(i,n-1), i.e. the entered program address A(k,j) is in the range of A(0,0) through A(i,n-1). The read signal (RD-a) of upper-digit memory element 1 is produced by obtaining a logical product between the select signal "a" and the common read signal (RD). Hence, the information data a(j,k) stored in inherent address a(j,k) of upper-digit memory element 1 is read out and outputted from input/output terminal I/O-a.

On the other hand, the "B" judgement circuit 6 does not generate the judge signal "B" as the entered program address A(j,k) is not identical with any one of B(O) through B(i). However, select signal "b" can be produced by obtaining a logical sum between an output of "B" judgement circuit 6 and a judgement output of judgement circuit 5. Then, the read signal (RD-b) of lower-digit memory element 2 is produced by obtaining a logical product between the select signal "b" and the common read signal (RD). Hence, the state-of-radio-transmission data β(j) stored in inherent address b(j) of lower-digit memory element 2 is read out and outputted from input/output terminal I/O-b.

In this manner, the memory system of this embodiment makes it possible to read out the-stored data as a combination of information data Q(j,k) and state-of-radio-transmission data β(j) by entering the common program address (ADR).

FIG. 5 shows a relationship between each input program address (ADR) and various output signals, such as judge signal "A" generated from "A" judgement circuit 5, judge signal "B" generated from "B" judgement circuit 6, select signal "a", inherent address ADR-a of upper-digit memory element 1 generated from address "a" generating circuit 3, select signal "b", and inherent address ADR-b of lower-digit memory element 2 generated from address "b" generating circuit 4.

Figure 6:
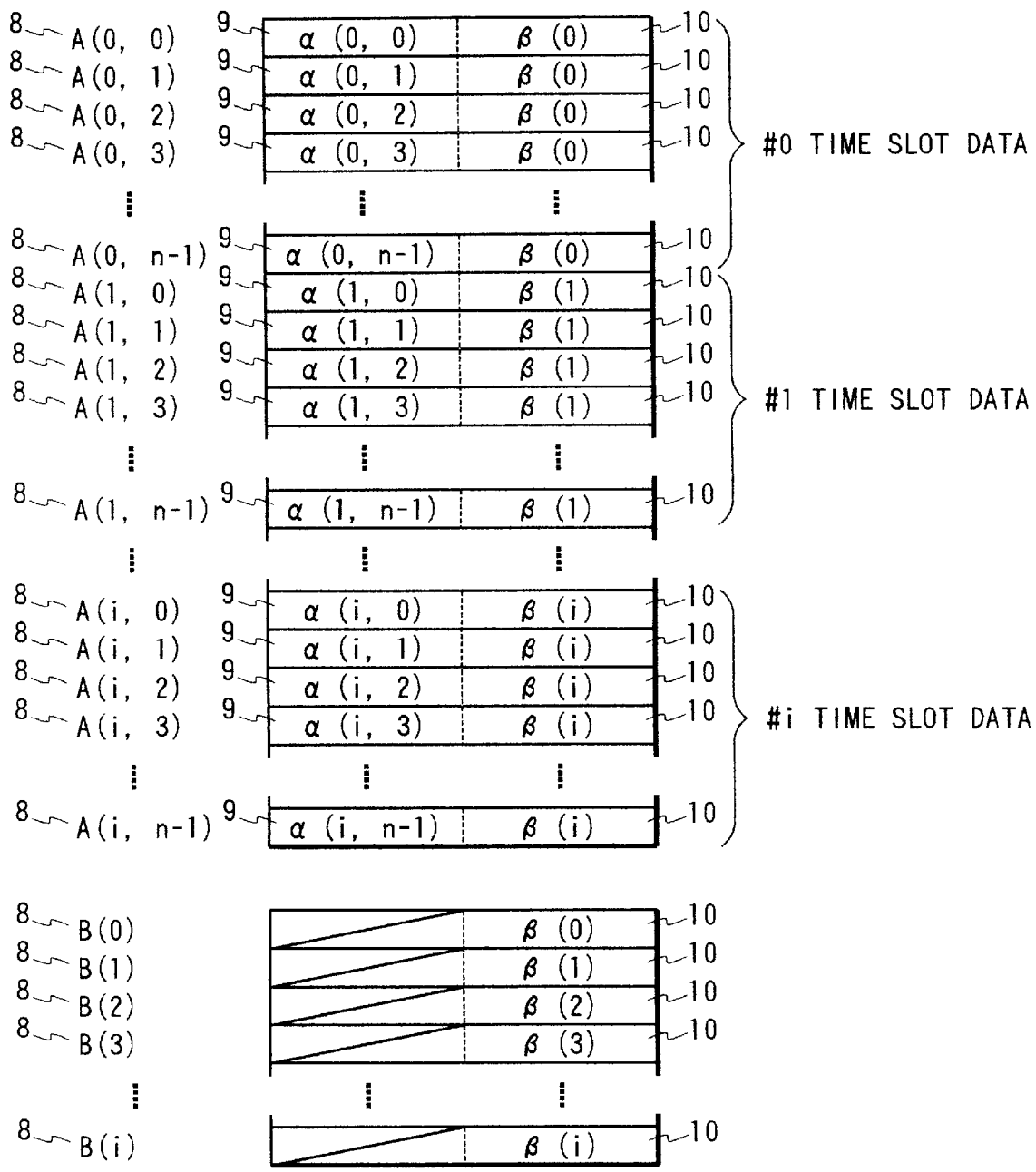
FIG. 6 is a memory map showing the relationship between address and data in the memory system of the embodiment of the present invention.

FIG. 6 is a memory map showing a relationship between each program address (ADR) and stored data in the memory system of this embodiment having the above-described input/output relations. In this drawing, a region ranging from address A(0,0) through A(0,n−1) is allocated to #0 time slot data. Each storage region is separated into an upper-digit part storing information data 9 and a lower-digit part storing state-of-radio-transmission data 10. A region ranging from address A(1,0) through A(1,n−1) is allocated to #1 time slot data. Similarly, a region ranging from address A(i,0) through A(i,n−1) is allocated to #i time slot data.

A storage region allocated to address B(0) has a lower-digit part storing state-of-radio-transmission data 10 of #0 time slot data. In the same manner, storage regions allocated to addresses B(1) through B(i) have lower-digit parts storing state-of-radio-transmission data 10 of #1 through #i time slot data, respectively.

Figure 7:
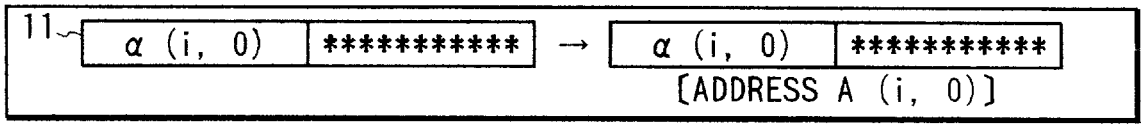
FIG. 7 is a flow chart showing the storing operation procedure in the embodiment of the present invention.
Figure 7:
Figure 7:
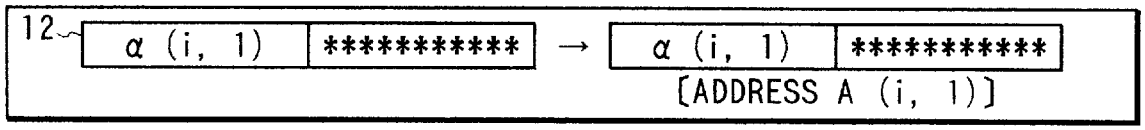
Figure 7:
Figure 7:
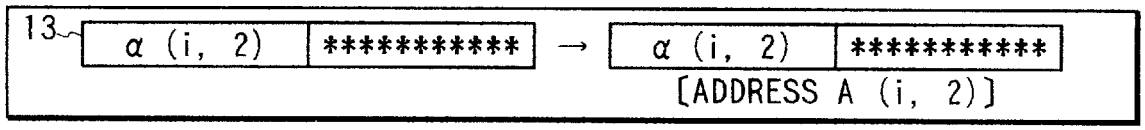
Figure 7:
Figure 7:
Figure 7:
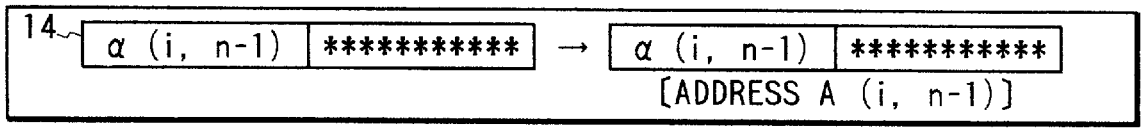
Figure 7:
Figure 7:
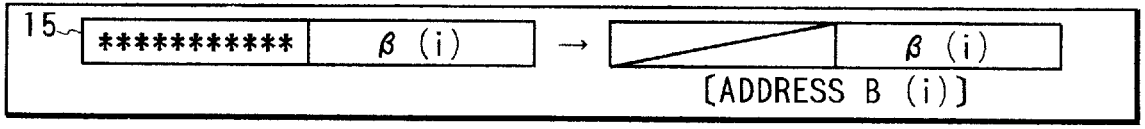

The operation of this memory system will be explained with reference to the flow chart of FIG. 7, wherein the writing operation of #i time slot data is illustrated.

Step 1: Write signal WR common to all the memory elements is turned on upon entry of program address A(i,0) to store data 11 having an upper-digit part representing information data a (i,0) and a lower-digit part representing unknown data. In this case, as shown in FIG. 5, select signal "a" is 1 and the inherent address -of upper-digit memory element 1 is a(i,0). Hence, information data α(i,0) is stored into address a(i,0). Meanwhile, select signal "b" is 1 and the inherent address of lower-digit memory element 2 is b(i). Thus, the unknown data is stored into address b(i). Accordingly, the storage region corresponding to program address A(i,0) stores information data α(i,0) in its upper-digit part and the unknown data in its lower-digit part.

Step 2: Similarly, program address A(i,1) is entered to store data 12 having an upper-digit part representing information data α(i,1) and a lower-digit part representing unknown data. In this case, information data α(i,1) is stored in inherent address a(i,1) of upper-digit memory element 1, while the unknown data is stored in inherent address b(i) of lower-digit memory element 2.

Step 3: Similarly, program address A(i,2) is entered to store data 13 having an upper-digit part representing information data α(i,2) and a lower-digit part representing unknown data. In this case, information data α(i,2) is stored in inherent address α(i,2) of upper-digit memory element 1, while the unknown data is stored in inherent address b(i) of lower-digit memory element 2.

By repeating the similar operation until step n, information data α(i,0) through α(i,n−1) is stored in inherent addresses a(i,0) through a(i,n−1) of upper-digit memory element 1, while unknown data is stored in inherent address b(i) of lower-digit memory element 2. Thereafter, the procedure proceeds to the next step.

Step n+1: Program address B(i) is entered to store data 15 having an upper-digit part representing unknown data and a lower-digit part representing state-of-radio-transmission data β(i). In this case, as shown in FIG. 5, select signal "a" is 0 which means that upper-digit memory element 1 is not selected. Meanwhile, select signal "b" is 1 and the inherent address of lower-digit memory element 2 is β(i). Hence, state of-radio-transmission data β(i) is stored in inherent address b(i).

The inherent address b(i) of lower-digit memory element 2 serves as data storage region for the lower-digit part of respective program addresses A(i,0) through A(i,n−1). Therefore, state-of-radio-transmission data β(i) of #i time slot is stored in each lower-digit part of addresses A(i,0) through A(i,n−1).

Through the above-described sequential operations, the storage region corresponding to program addresses A(i,0) through A (i,n−1) stores #i time slot data each in the form of a combination of information data and state-of-radio-transmission data inherent to #i time slot.

In this manner, this embodiment allows the memory system to easily store both upper-digit data and lower-digit data in accordance with each program address, without requiring the preprocessing such as bit arithmetic operations. Thus, it becomes possible to reduce or omit many of computation steps.

FIG. 8 is a block diagram showing an arrangement of a modified memory system in accordance with the present invention, similar to the memory system shown in FIG. 4.

The modified embodiment of FIG. 8 is different from FIG. 4 embodiment in that OR circuit 71 is omitted and in that judge signal "B" is directly entered as select signal "b" into AND circuit 61 while select signal "a" is entered into AND circuit 62.

More specifically, AND circuit 61 has two input terminals receiving the select signal "b" generated from "B" judgement circuit 6 and write signal WR common to all the memory elements 1, 2, to obtain a logical product between select signal "b" and the common write signal WR. Obtaining the logical product between select signal "b" and the common write signal WR will produce a write signal WR-b inherent to upper-digit memory element 2 which is entered into lower-digit memory element 2 from an output terminal of AND circuit 61.

Meanwhile, AND circuit 62 has two input terminals receiving the select signal "a" generated from "A" judgement circuit 5 and read signal, RD common to all the memory elements 1, 2, to obtain a logical product between select signal "a" and the common read signal RD. Obtaining the logical product between select signal "a" and. the common read signal RD will produce a read signal RD-b inherent to lower-digit memory element 2 which is entered into lower-digit memory element 2 from an output terminal of AND circuit 62.

By adopting the arrangement of FIG. 8, write signal WR-b is entered into lower-digit memory element 2 only when "B" judgement circuit 6 generates select signal "b".

Other arrangement of this modified embodiment is the same as that of FIG. 4 embodiment; therefore will not be explained again. Furthermore, this modified embodiment operates in the same manner as FIG. 4 embodiment, bringing the same effect, as described above.

As apparent from the foregoing description, the present invention provides a memory system which comprises an upper-digit memory element and a lower-digit memory element independent from each other and designated by the same address while allowing the use of another address for reading and writing the lower-digit memory element only. It is advantageous in that the bit arithmetic processing can be eliminated in the storage operation of information data and state-of-radio-transmission data on the same address. The number of processing steps required for the bit arithmetic processing can be fairly reduced. For example, the memory system of the present invention requires only n+1 steps, whereas the previously-described prior art. memory system requires a total of 3n+1 steps.

Furthermore, the memory system of the present invention brings the merit in not requiring a large capacity to each memory element because the memory capacity required for storing the state-of-radio-transmission data is only one data per time slot.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A memory system which is capable of using a common address for reading out a combination of upper-digit data and lower-digit data, comprising:

an upper-digit memory element for exclusively storing upper-digit data representing information data;

a lower-digit memory element for exclusively storing lower-digit data representing state-of-radio-transmission data inherent to corresponding time slots;

a first address generating-circuit inputting a program address for converting said program address into an inherent address of said upper-digit memory element, said first address generating circuit, when a program address A(j,k) is entered, converts said program address A(j,k) into a corresponding inherent address a(j,k), said inherent address (ADR-a) of said upper-digit memory element comprises a plurality of addresses a(0,0) through a(i,n−1) allocated to store information data a(0,0) through a(i, n−1) of #0 through #i time slots, respectively;

a second address generating circuit inputting the program address for converting said program address into an inherent address of said lower-digit memory element, said inherent address (ADR-b) of said lower-digit memory element comprises a plurality of addresses b(0) through b(i) allocated to store state-of-radio-transmission data β(0) through β(i) of #0 through #i time slots, respectively, said second address generating circuit, when any one of program addresses A(j,0) through A(j, n−1) is entered, converts said any one of said program addresses A(j,0) through A(j, n−1) into an inherent address b(j), and, when a program address B(j) is entered, converts said program address B(j) into an inherent address b(j) in a one-to-one manner, whereby both the inherent address a(j,k) of said upper-digit memory element and the inherent address b(j) of said lower-digit memory element are designated by said program address A(j,k), while only the inherent address b(i) of said lower-digit memory element is designated by said program address B(j);

a first judgement circuit inputting the program address for judging whether said program address is in a one-to-one relationship with any one of inherent addresses of said upper-digit memory element; and a second judgement circuit inputting the program address for judging whether said program address is in a one-to-one relationship with any one of inherent addresses of said lower-digit memory element.

2. A memory system which is capable of using a common address for reading out a combination of upper-digit data and lower-digit data, comprising:

an upper-digit memory element for exclusively storing upper-digit data representing information data, a write signal inherent to said upper-digit memory element is produced by obtaining a logical product between a select signal "a" and a write signal common to all the memory elements, while a read signal inherent to said upper-digit memory element is produced by obtaining a logical product between said select signal "a" and a read signal common to all the memory elements;

a lower-digit memory element for exclusively storing lower-digit data representing state-of-radio-transmission data inherent to corresponding time slots, a write signal inherent to said lower-digit memory element is produced by obtaining a logical product between a select signal "b" and the write signal common to all the memory elements, while a read signal inherent to said lower-digit memory element is produced by obtaining a logical product between said select signal "b" and the read signal common to all the memory elements;

a data input/output terminal of said upper-digit memory element is connected to an upper-digit side of a main bus while a data input/output terminal of said lower-digit memory element is connected to a lower-digit side of said main bus;

a first address generating-circuit inputting a program address for converting said program address into an inherent address of said upper-digit memory element;

a second address generating circuit inputting the program address for converting said program address into an inherent address of said lower-digit memory element;

a first judgement circuit inputting the program address for judging whether said program address is in a one-to-one relationship with any one of inherent addresses of said upper-digit memory element, said first judgement circuit makes a judgement as to whether an entered program address (ADR) is identical with any one of A(0,0) through A(i,n−1), and generates said select signal "a" indicating that said upper-digit memory element is selected when said entered program address (ADR) is identical with any one of A(0,0) through A(i,n−1); and a second judgement circuit inputting the program address for judging whether said program address is in a one-to-one relationship with any one of inherent addresses of said lower-digit memory element, said second judgement circuit makes a judgement as to whether the entered program address (ADR) is identical with any one of B(0) through B(i), and generates said select signal "b" indicating that said lower-digit memory element is selected when said entered program address (ADR) is identical with any one of B(0) through B(i).

3. A memory system which is capable of using a common address for reading out a combination of upper-digit data and lower-digit data, comprising:

an upper-digit memory element for exclusively storing upper-digit data representing information data;

a lower-digit memory element for exclusively storing lower-digit data representing state-of-radio-transmission data inherent to corresponding time slots;

a data input/output terminal of said upper-digit memory element is connected to an upper-digit side of a main bus while a data input/output terminal of said lower-digit memory element is connected to a lower-digit side of said main bus;

a first address generating-circuit inputting a program address for converting said program address into an inherent address of said upper-digit memory element, a write signal inherent to said upper-digit element is produced by obtaining a logical product between a select signal "a" and a write signal common to all memory elements, while a read signal inherent to said upper digit memory element is produced by obtaining a logical product between said select signal "a" and a read signal common to all the memory elements;

a second address generating circuit inputting the program address for converting said program address into an inherent address of said lower-digit memory element, a write signal inherent to said lower-digit memory element is produced by obtaining a logical product between a select signal "b" and the write signal common to all the memory elements, while a read signal inherent to said lower-digit memory element is produced by obtaining a logical product between said select signal "b" and the read signal common to all the memory elements; and a first judgement circuit inputting the program address for judging whether said program address is in a one-to-one relationship with any one of inherent addresses of said upper-digit memory element, said first judgement circuit makes a judgement as to whether an entered program address (ADR) is identical with any one of $A(0,0)$ through $A(i,n-1)$, and generates said select signal "a" indicating that said upper-digit memory element is selected when said entered program address (ADR) is identical with any one of $A(0,0)$ through $A(i,n-1)$; and a second judgement circuit inputting the program address for judging whether said program address is in a one-to-one relationship with any one of inherent addresses of said lower-digit memory element, said second judgement circuit makes a judgement as to whether the entered program address (ADR) is identical with any one of B(0) through $\beta(i)$, and generates a judgement signal "B" when said entered program address (ADR) is identical with any one of B(0) through $\beta(i)$, and a select signal "b" is produced by obtaining a logical sum between said judge signal "B" and said select signal "a", said select signal "b" indicating that said lower-digit memory element is selected.

4. A memory system which is capable of using a common address for reading out a combination of upper-digit data and lower-digit data, comprising:

an upper-digit memory element for exclusively storing upper-digit data representing information data, a lower-digit memory element for exclusively storing lower-digit data representing state-of-radio-transmission data inherent to corresponding time slots;

a data input/output terminal of said upper-digit memory element is connected to an upper-digit side of a main bus while a data input/output terminal of said lower-digit memory element is connected to a lower-digit side of said main bus;

a first address generating-circuit inputting a program address for converting said program address into an inherent address of said upper-digit memory element;

a second address generating circuit inputting the program address for converting said program address into an inherent address of said lower-digit memory element;

a first judgement circuit inputting the program address for judging whether said program address is in a one-to-one relationship with any one of inherent addresses of said upper-digit memory element said first judgement circuit makes a judgement as to whether an entered program address (ADR) is identical with any one of $A(0,0)$ through $A(i,n-1)$, and generates a select signal "a" indicating that said upper-digit memory element is selected when said entered program address (ADR) is identical with any one of $A(0,0)$ through $A(i,n-1)$, a write signal inherent to said upper-digit memory element is produced by obtaining a logical product between said select signal "a" and a write signal common to all the memory elements, while a read signal inherent to said upper-digit memory element is produced by obtaining a logical product between said select signal "a" and a read signal common to all the memory elements; and a second judgement circuit inputting the program address for judging whether said program address is in a one-to-one relationship with any one of inherent addresses of said lower-digit memory element said second judgement circuit makes a judgement as to whether the entered program address (ADR) is identical with any one of B(0) through B(i), and generates a select signal "b" indicating that said lower-digit memory element is selected when said entered program address (ADR) is identical with any one of B(0) through B(i), a write signal inherent to said lower-digit memory element is produced by obtaining a logical product between said select signal "b" and the write signal common to all the memory elements, while a read signal inherent to said lower-digit memory element is produced by obtaining a logical product between said select signal "a" produced by said first judgement circuit and the read signal common to all the memory elements.

* * * * *